US012689283B2

(12) United States Patent
La Rosa et al.

(10) Patent No.: US 12,689,283 B2
(45) Date of Patent: Jul. 21, 2026

(54) CMOS INTEGRATION OF A HIGH BANDWIDTH OPTICALLY ISOLATED CURRENT SENSOR

(71) Applicant: STMicroelectronics International N.V., Geneva (CH)

(72) Inventors: Roberto La Rosa, Viagrande (IT); Sebastiano Messina, Mascalucia (IT); Marco Torrisi, Gravina di Catania (IT); Davide Giuseppe Patti, Mascalucia (IT); Jean Camiolo, Sassenage (FR); Jonathan Steckel, Corenc (FR)

(73) Assignee: STMicroelectronics International N.V., Geneva (CH)

( * ) Notice: Subject to any disclaimer, the term of this patent is extended or adjusted under 35 U.S.C. 154(b) by 183 days.

(21) Appl. No.: 18/790,269

(22) Filed: Jul. 31, 2024

(65) Prior Publication Data

US 2026/0039179 A1    Feb. 5, 2026

(51) Int. Cl.
H02M 1/00      (2006.01)
G01R 15/22      (2006.01)
(Continued)

(52) U.S. Cl.
CPC .......... H02M 1/0009 (2021.05); G01R 15/22 (2013.01); G01R 15/246 (2013.01); H02M 3/158 (2013.01)

(58) Field of Classification Search
CPC .... H02M 1/0009; H02M 3/158; G01R 15/22; G01R 15/246
See application file for complete search history.

(56) References Cited

U.S. PATENT DOCUMENTS 7,460,741 B2 * 12/2008 Sanders .............. G01R 15/246
                                                    385/12
8,655,115 B2 * 2/2014 Oh ....................... G01R 15/246
                                                    385/12
(Continued)

FOREIGN PATENT DOCUMENTS

WO      WO-9940446 A1 * 8/1999 ........... G01R 15/241

OTHER PUBLICATIONS

Biglarbegian, Mehrdad, et al.: "Development of Current Measurement Techniques for High Frequency Power Converters," Nov. 21, 2016, 7 pgs.

Primary Examiner — Monica Lewis
Assistant Examiner — Jye-June Lee
(74) Attorney, Agent, or Firm — Crowe & Dunlevy LLC

(57)            ABSTRACT

A galvanically isolated current sensor for power converters is disclosed. The sensor includes a package housing a first integrated circuit (IC), a light emitting layer, an optical waveguide, a photosensing layer, and a second IC. The light emitting layer emits light proportional to a reference current. The optical waveguide modulates the light based on a magnetic field generated by the current to be sensed. The photosensing layer generates a photocurrent representative of the modulated light's intensity. The second IC outputs a sense current based on the photocurrent. The optical waveguide includes polarizers and a Faraday rotator material to effectuate the modulation. Different embodiments of control circuitry for processing the sense current are described, including a flash ADC-based system, a voltage-controlled oscillator with a high-speed counter, and a current-controlled delay line with a low-speed counter.

18 Claims, 2 Drawing Sheets

(51) Int. Cl.
    *G01R 15/24*         (2006.01)
    *H02M 3/158*       (2006.01)

(56)            References Cited

U.S. PATENT DOCUMENTS

| | | | |
|---|---|---|---|
| 11,119,219 B1 | 9/2021 | LaChapelle et al. | |
| 2005/0083033 A1* | 4/2005 | Kurosawa | G01R 15/246 |
| | | | 324/96 |
| 2007/0036212 A1 | 2/2007 | Leung et al. | |
| 2016/0033557 A1 | 2/2016 | Hwangbo | |
| 2016/0084894 A1 | 3/2016 | Govindaraj et al. | |
| 2021/0285987 A1* | 9/2021 | Yao | G01R 15/246 |
| 2022/0093811 A1 | 3/2022 | Hermes et al. | |
| 2023/0288641 A1* | 9/2023 | Judendorfer | G01R 15/246 |
| 2024/0110999 A1 | 4/2024 | Ding et al. | |
| 2024/0118496 A1 | 4/2024 | Dulk | |
| 2024/0133932 A1 | 4/2024 | Ausserlechner | |

* cited by examiner

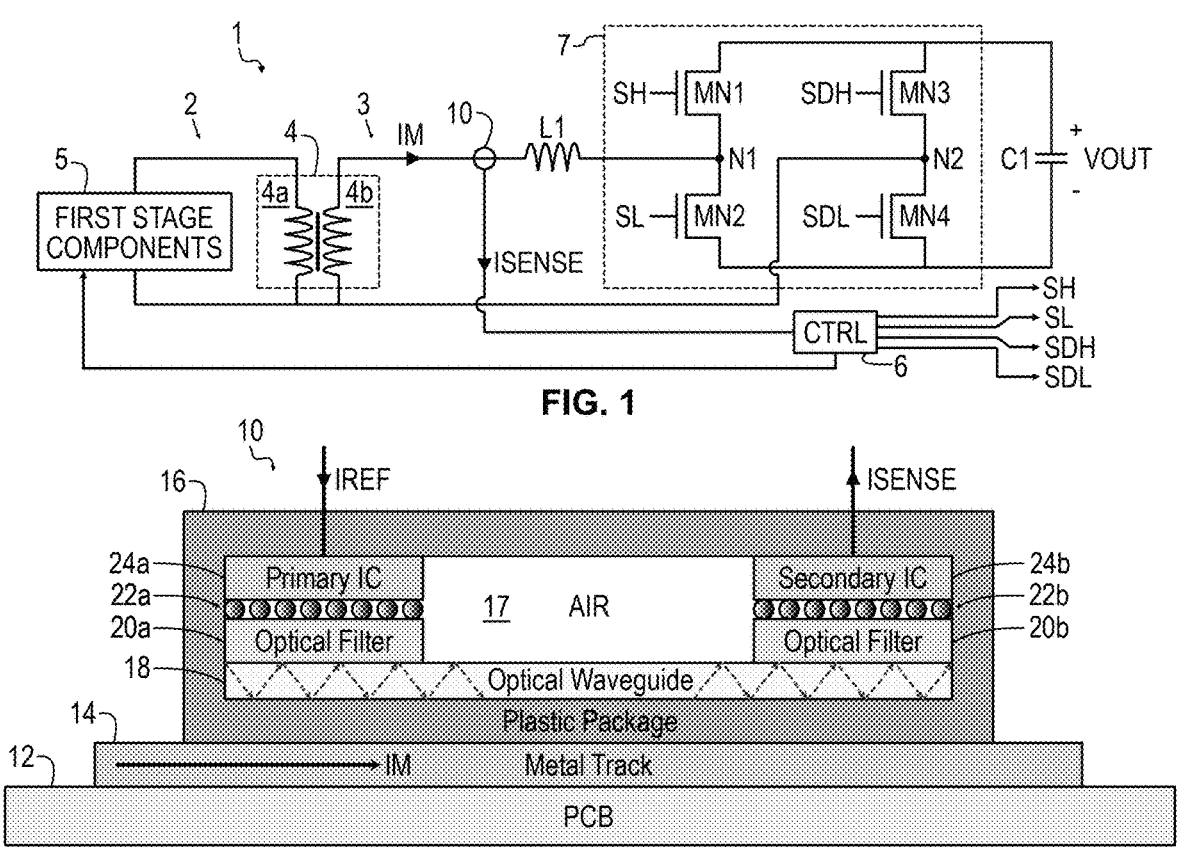
FIG. 1
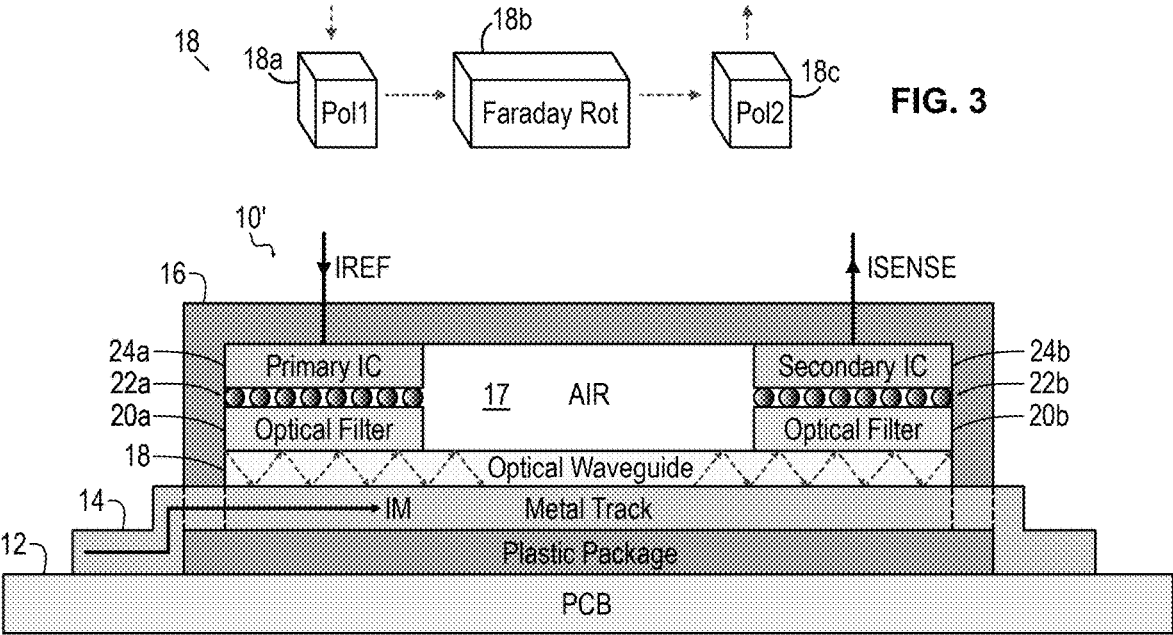
FIG. 2
FIG. 3
FIG. 4

CMOS INTEGRATION OF A HIGH BANDWIDTH OPTICALLY ISOLATED CURRENT SENSOR

TECHNICAL FIELD

This disclosure relates generally to current sensing devices and methods in power electronics, and more specifically, this disclosure pertains to high-bandwidth, galvanically isolated current sensors for use in high-frequency power converters.

BACKGROUND

A galvanically isolated power converter is an electrical device that transfers power between two circuits while maintaining electrical isolation between them. This isolation is achieved through the use of devices that prevent direct electrical connection between the input and output sides of the converter, such as transformers, and is used in many applications to protect sensitive equipment, prevent ground loops, and provide for safety in high-voltage systems.

In high frequency, galvanically isolated power converters, current sensing is used for proper operation and control, namely because it provides feedback facilitating precise control of power flow and voltage regulation, it provides for detection of overcurrent conditions and short circuits, and it allows for accurate efficiency measurements and power management.

It is desired for a current sensor employed in such applications to meet several stringent requirements. First, the sensor clearly must be isolated to in order to maintain galvanic isolation between the power converter stages; if the sensor is not isolated, it can create a conductive path between the input and output sides of the converter, defeating the purpose of galvanic isolation. In addition, the sensor should be capable of bidirectional current detection because it is used for applications such as renewable energy systems or battery storage, where energy may flow from the source to the load or vice versa. Moreover, the sensor is to exhibit a high bandwidth and a fast response time, as this provides the sensor with the ability to accurately capture the rapidly changing current waveforms, which is useful because high-frequency power converters operate with very short switching periods, and the current waveform can change significantly within these short intervals. Finally, the sensor is to be able to simultaneously detect DC, high frequency, and low frequency harmonics present in the current signal, as this capability is important for accurately measuring the total current, identifying potential issues such as electromagnetic interference, and implementing advanced control strategies.

The response time of the current sensor is directly related to the operating frequency of the power converter. As the power conversion frequency increases, the requisite response time increases. If the power converter operates at a frequency of 1 MHz (e.g., has a period of µs), the response time of the current sensor must be less than 100 ns to ensure accurate tracking of the current waveform. However, for a power converter operating at 10 MHz (e.g., has a period of 100 ns), the response time of the current sensor must be reduced to less than 10 ns.

Existing current sensing technologies often lack one or more of the requisite characteristics for use in high frequency, galvanically isolated power converters. Therefore, there is a clear need for a new current sensor design that exhibits ultra-fast response time (on the order of nanoseconds), high bandwidth, bidirectional current detection capability, and the ability to detect DC, high frequency, and low frequency components simultaneously, all while maintaining galvanic isolation.

SUMMARY

A power converter has circuitry, a metal trace through which a current output by the circuitry flows, and a current sensor configured to measure the current. The current sensor has a package containing a first integrated circuit (IC), a light emitting layer operatively coupled to the first IC and configured to emit light having an intensity proportional to a reference current received by the first IC, an optical waveguide having an input receiving the light emitted by the light emitting layer and having an output, wherein the optical waveguide is configured to modulate the light passing therethrough based on a magnetic field generated by the current in the metal trace, a photosensing layer configured to generate a photocurrent representative of the intensity of the light output from the optical waveguide, and a second integrated circuit (IC) operatively coupled to the photosensing layer and configured to output a sense current based upon the photocurrent, with the sense current being representative of the current in the metal trace.

The light emitting layer may include a first layer of quantum dots, and the first IC may be configured to excite the first layer of quantum dots to emit the light having the intensity proportional to the reference current.

The photosensing layer may include a second layer of quantum dots, and the second IC may be configured to generate the sense current based on the photocurrent.

The package may also have a first optical filter configured to filter the light emitted by the light emitting layer prior to entry of that light into the optical waveguide, and a second optical filter configured to filter the light output from the optical waveguide prior to impingement of that light upon the photosensing layer.

The optical waveguide may include a first polarizer at the input configured to linearly polarize the light entering the optical waveguide, a second polarizer at the output, and a Faraday rotator material disposed between the first polarizer and the second polarizer. The Faraday rotator material may be configured to rotate a plane of polarization of the light passing therethrough by an angle proportional to intensity of the magnetic field generated by the current in the metal trace. The second polarizer may be oriented at a predetermined angle relative to the first polarizer to selectively transmit light based on the rotation of its plane of polarization, thereby modulating the intensity of the light output from the optical waveguide in proportion to the current in the metal trace.

The metal trace may be disposed on a printed circuit board (PCB), and the package of the current sensor may be affixed to the PCB above the metal trace.

The metal trace may pass through the package of the current sensor.

The power converter may include control circuitry configured to receive the sense current from the current sensor. The control circuitry may include a voltage divider with multiple resistors connected in series between an input receiving the sense current and ground, a flash analog-to-digital converter (ADC) having inputs connected to taps between the resistors of the voltage divider, a controller configured to receive a digital output from the flash ADC, and a driver stage configured to receive control signals from the controller and generate output signals for controlling the circuitry of the power converter.

Alternatively, the control circuitry may include a resistor connected between an input receiving the sense current and ground, a voltage controlled oscillator (VCO) having an input connected to a node between the input receiving the sense current and the resistor, a high-speed counter configured to receive a low-frequency signal output from the VCO and being clocked by a clock signal having a frequency greater than a frequency of the low-frequency signal, a controller configured to receive a count value from the high-speed counter, and a driver stage configured to receive control signals from the controller and generate output signals for controlling the circuitry of the power converter.

In another alternative, the control circuitry may include a current controlled delay line (CCDL) having a current input receiving the sense current, a low-speed counter configured to count a delay between a low-frequency reference signal input to the CCDL and a delayed version of the low-frequency reference signal output from the CCDL, wherein the low-speed counter is clocked by a clock signal having a higher frequency than the low-frequency reference signal, a controller configured to receive a count value from the low-speed counter, and a driver stage configured to receive control signals from the controller and generate output signals for controlling the circuitry of the power converter.

A method of galvanically isolated current sensing includes generating a reference current, emitting light having an intensity proportional to the reference current, passing the emitted light through an optical waveguide, modulating the light passing through the optical waveguide based on a magnetic field generated by a current to be sensed, detecting the modulated light output from the optical waveguide, generating a photocurrent representative of an intensity of the detected modulated light, and outputting a sense current based on the photocurrent, the sense current being representative of the current to be sensed.

Emitting light may include exciting a first layer of quantum dots with a first integrated circuit (IC) to emit the light having the intensity proportional to the reference current.

Detecting the modulated light may include using a second layer of quantum dots to generate the photocurrent.

The method may include filtering the emitted light prior to passing it through the optical waveguide, and filtering the modulated light output from the optical waveguide prior to detecting it.

Modulating the light passing through the optical waveguide may include linearly polarizing the light entering the optical waveguide, rotating a plane of polarization of the linearly polarized light by an angle proportional to an intensity of the magnetic field generated by the current to be sensed, and selectively transmitting the light based on the rotation of its plane of polarization.

The method may include converting the sense current to a digital value using a flash analog-to-digital converter (ADC), generating control signals based on the digital value, and controlling a power converter circuit based on the control signals.

The method may include converting the sense current to a voltage, generating a low-frequency signal having a frequency proportional to the voltage, counting cycles of the low-frequency signal using a high-speed counter, generating control signals based on a count value from the high-speed counter, and controlling a power converter circuit based on the control signals.

The method may include delaying a low-frequency reference signal based on the sense current using a current controlled delay line (CCDL), counting a delay between the low-frequency reference signal and a delayed version of the low-frequency reference signal, generating control signals based on the counted delay, and controlling a power converter circuit based on the control signals.

BRIEF DESCRIPTION OF THE DRAWINGS

FIG. 1 is a schematic block diagram of a power converter utilizing the high bandwidth optically isolated current sensor disclosed herein.

FIG. 2 is a diagrammatical representation of the current sensor of FIG. 1.

FIG. 3 is a diagrammatical representation of the optical waveguide of FIG. 2.

FIG. 4 is a diagrammatical representation of another embodiment of the current sensor of FIG. 1.

DETAILED DESCRIPTION

Figure 5:
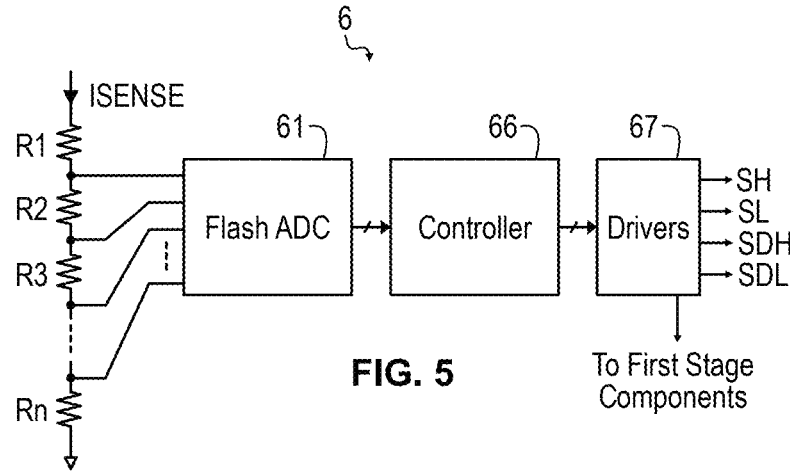
FIG. 5 is a schematic block diagram of a first embodiment of the control circuitry of FIG. 1.

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Described herein with reference to FIG. 1 is a galvanically isolated power converter 1 utilizing a current sensor 10 capable of meeting the above-mentioned requirements. The galvanically isolated power converter 1 includes a first stage 2 and a second stage 3, with power being transferred from the first stage 2 to the second stage 3 through galvanic isolation transformer 4. To accomplish this, first stage components 5, under control of control circuitry 6, cause generation of a time varying current in the primary side 4a of the galvanic isolation transformer 4, in turn inducing a time varying current in the secondary side 4b of the galvanic isolation transformer 4. This time varying current IM flowing from the secondary side 4b of the galvanic isolation transformer 4 is measured by a current sensor 10, smoothed by input inductor L1, and rectified by full-bridge 7 to thereby generate an output voltage VOUT across output capacitor C1.

The full-bridge 7 is comprised of: n-channel transistor MN1 having its drain connected to a first terminal of the output capacitor C1, its source connected to node N1, and its gate controlled by a control signal SH; n-channel transistor MN2 having its drain connected to node N1, its source connected to a second terminal of the output capacitor C1, and its gate controlled by a control signal SL; n-channel transistor MN3 having its drain connected to the first terminal of the output capacitor C1, its source connected to node N2, and its gate controlled by a control signal SDH; and n-channel transistor MN4 having its drain connected to node N2, its source connected to the second terminal of the output capacitor C1, and its gate controlled by a control signal SDL. The input inductor L1 is connected between the secondary side 4b of the galvanic isolation transformer 4 and node N1.

The full-bridge 7 acts as a synchronous rectifier, converting the AC current from the transformer secondary into a DC current. The input inductor L1 smooths the rectified current from the full-bridge 7, working in conjunction with the output capacitor C1 to filter the output voltage VOUT.

The current sensor 10, in an isolated fashion described below, measures the time-varying current IM flowing from the secondary side 4b of the galvanic isolation transformer 4. It generates a sense current ISENSE that is proportional to IM while maintaining galvanic isolation between the primary and secondary sides of the converter. Based upon the sense current ISENSE, the control circuitry 6 controls the first stage components 5, as well as generates the control signals SH (switch high), SL (switch low), SDH (switch diagonal high), and SDL (switch diagonal low), to effectuate power transfer from the first stage 2 to the second stage 3.

A first embodiment of the current sensor 10 is described with reference to FIG. 2. First, note that the power converter 1 is formed on a printed circuit board (PCB) 12, and that the metal track 14 on the PCB 12 represents the lead schematically shown as passing through the current sensor 10, with the current IM flowing through the metal track 14. The sensor 10 is contained within a plastic package 16 affixed to the metal track 14.

Within the plastic package 16, a primary integrated circuit (IC) 24a cooperates with a layer of quantum dots 22a to generate light representative of a fixed reference current IREF. The quantum dots 22a are semiconductor nanocrystals, typically made of materials such as cadmium selenide (CdSe) or indium phosphide (InP), with sizes ranging from 2 to 10 nanometers. When electrically excited by the primary IC 24a, these quantum dots emit light at specific wavelengths determined by their size and composition. The intensity of this emitted light is controlled to represent the reference current.

This light is then filtered by optical filter 20a, which selects specific wavelengths to enhance the signal-to-noise ratio, and then passed through an optical waveguide 18. As the light exits the optical waveguide 18, it passes through optical filter 20b, and then through quantum dots 22b. These quantum dots 22b, similar in composition to 22a but optimized for light detection, absorb the incoming light and generate electron-hole pairs. The secondary integrated circuit (IC) 24b measures the resulting photocurrent, converting it to a sense current ISENSE representative of the current IM. A cavity 17 filled with air separates the combination of primary IC 24a, quantum dots 22a, and optical filter 20a from the combination of secondary IC 24b, quantum dots 22b, and optical filter 20b.

Referring additionally to FIG. 3, the optical waveguide 18 is comprised of a first polarizer 18a receiving the light output by the quantum dots 22a after passage through the optical filter 20a, a Faraday rotator material 18b receiving this light after passage through the first polarizer 18a, and a second polarizer 18c receiving this light after passage through the Faraday rotator material 18b. After passage through the second polarizer 18c, the light is output to the optical filter 20b.

The Faraday rotator material 18b may be a magneto-optical (MO) polycrystalline garnet material (e.g., a bismuth-substituted yttrium iron garnet thin-film grown on silicon), and serves to rotate the plane of polarization of the light passing therethrough. This rotation is proportional to the intensity of the magnetic field emitted by the metal track 14 as a result of the current IM flowing through the metal track 14.

The Faraday effect causes the plane of polarization of the light to rotate by an angle: where V is the Verdet constant of the material, B is the magnetic field strength, and d is the path length through the material. The magnetic field B is directly proportional to the current IM in the metal track 14.

The first polarizer 18a provides for the light entering the Faraday rotator material 18b being linearly polarized. As this light passes through the Faraday rotator material 18b, its plane of polarization rotates. The second polarizer 18c selectively transmits light based on its polarization state. As the Faraday rotator material 18b rotates the plane of polarization of the incoming light, the amount of light passing through the second polarizer 18c changes, resulting in a variation of light intensity that correlates with the current IM.

By setting the second polarizer 18c at a 45-degree angle relative to the first polarizer 18a, the system can be configured so that an increase in current IM (and thus magnetic field) causes a decrease in transmitted light intensity. Conversely, by setting the second polarizer parallel or perpendicular to the first, the transmitted light intensity can be made to increase with increasing current.

Thus, the greater the current IM, the greater the rotation of the light's polarization, which results in a change (either increase or decrease, depending on the polarizer configuration) in the light intensity reaching the quantum dots 22b. This, in turn, affects the magnitude of the sense current ISENSE generated by the secondary IC 24b.

An alternative configuration for the current sensor 10' is now described with reference to FIG. 4. The difference in this configuration compared to the current sensor 10 is that here, the metal track 14b passes directly through the plastic package 16, rather than being positioned underneath it. By passing the metal track 14b through the plastic package 16, the Faraday rotator material 18b is positioned much closer to the metal track 14. This proximity significantly increases the strength of the magnetic field experienced by the Faraday rotator material 18b, resulting in a larger rotation of the light's polarization for a given current. Consequently, this configuration offers enhanced sensitivity to current changes. In addition, the closer proximity of the metal track 14b to the sensing elements (including the primary IC 24a, quantum dots 22a, secondary IC 24b, and quantum dots 22b) reduces the influence of external magnetic fields, potentially improving the signal-to-noise ratio of the sensor 10'.

While the embodiments described above utilize quantum dots 22a and 22b, it should be understood that alternative light-emitting and light-detecting devices may be employed within the package 16. In place of quantum dots 22a, any suitable device that fits within the package 16 and emits light with an intensity proportional to the reference current IREF may be used. Such devices may include, but are not limited to, light-emitting diodes (LEDs), organic light-emitting diodes (OLEDs), or micro-scale lasers. Similarly, in place of quantum dots 22b, any suitable device that fits within the package 16 and produces a photocurrent proportional to the intensity of light output from the optical waveguide 18 may be utilized. These alternative light-detecting devices could include, but are not limited to, photodiodes, phototransistors, or photoresistors. The choice of light-emitting and light-detecting devices may be based on factors such as size constraints, wavelength compatibility with the optical waveguide and filters, response time, sensitivity, and power consumption. Regardless of the specific devices used, the fundamental principle of operation remains the same: light intensity modulation based on the current to be sensed, followed by the generation of a proportional sense current.

The readout of the sense current ISENSE by the control circuitry 6 is now described. To that end, a first embodiment of the control circuitry 6 is now described with reference to FIG. 5. Here, the sense current ISENSE is connected to ground through a voltage divider formed of n resistors, shown as resistors R1, . . . , Rn connected in series. This voltage divider converts the current signal to a plurality of voltage signals. A flash ADC 16, with a resolution of m bits, receives a plurality of input voltages from the taps between the resistors R1, . . . , Rn, then generates a digitized version of the sense current ISENSE for output to the controller 66. The controller 66, based upon the digitized sense current, generates pre-driving signals and/or control signals to the driver stage 67, which then outputs SH, SL, SDH, SDL, as well as provides the control to the first stage components 5, as described hereinabove.

Figure 6:
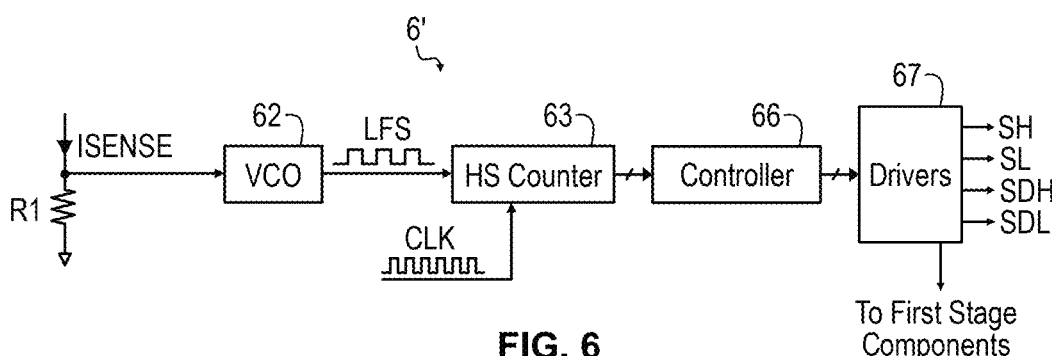
FIG. 6 is a schematic block diagram of a second embodiment of the control circuitry of FIG. 1.

A second embodiment of the control circuitry 6' is now described with reference to FIG. 6. Here, the sense current ISENSE is connected to ground through resistor R1, with the voltage across resistor R1 providing input to a voltage controlled oscillator (VCO) 62. The VCO 62 generates an output frequency proportional to its input voltage, thus producing a low-frequency signal (LFS) representative of the sense current ISENSE. This LFS is output to a high-speed counter (HS Counter) 63. The HS counter 63 is clocked by a clock signal CLK which has a higher frequency than that of the LFS, and provides a count representative of the frequency of the LFS (and thus the sense current ISENSE) to the controller 66. The controller 66, based upon the count, generates pre-driving signals and/or control signals to the driver stage 67, which then outputs SH, SL, SDH, SDL, as well as provides the control to the first stage components 5, as described hereinabove.

Figure 7:
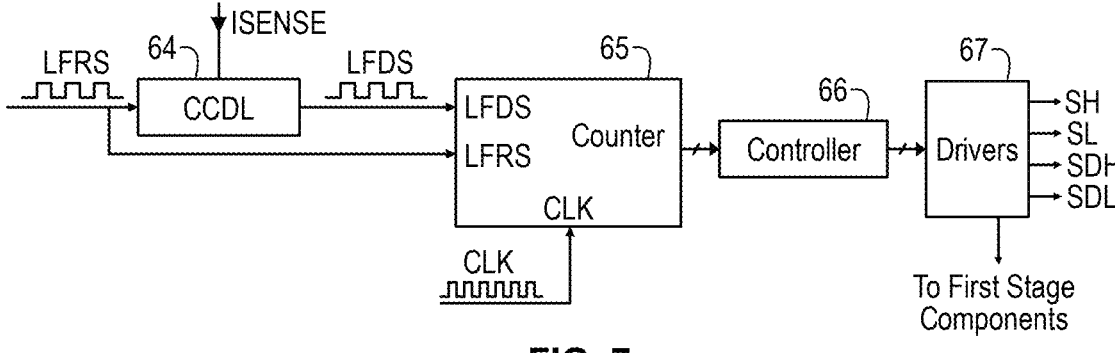
FIG. 7 is a schematic block diagram of a third embodiment of the control circuitry of FIG. 1.

A third embodiment of the control circuitry 6' is now described with reference to FIG. 7. Here, the sense current ISENSE is provided as input to a current controlled delay line (CCDL) 64. The CCDL 64 introduces a time delay proportional to the input current, delaying an input low-frequency reference signal (LFRS) based upon ISENSE to generate a low-frequency delayed signal (LFDS). A low-speed counter (LS Counter) 65 is clocked by a clock signal CLK which has a higher frequency than that of LFDS and LFRS, and counts the delay between LFRS and LFDS (e.g., the elapsed time between the rising edges of LFRS and LFDS). This count, representative of ISENSE, is output to the controller 66. The controller 66, based upon the count, generates pre-driving signals and/or control signals to the driver stage 67, which then outputs SH, SL, SDH, SDL, as well as provides the control to the first stage components 5, as described hereinabove.

The current sensor described herein offers several advantages over conventional current sensing technologies. First, it maintains galvanic isolation between the primary and secondary sides of the power converter. The use of optical transmission for current sensing eliminates the need for bulky isolation transformers or optocouplers, allowing for a more compact and cost-effective design. The sensor's ability to measure high-frequency AC currents with high accuracy makes it particularly suitable for modern switch-mode power supplies and other high-frequency applications. The implementation of quantum dots or alternative light-emitting and light-detecting devices within a single package results in improved sensitivity and a wider dynamic range compared to traditional optical sensors. Furthermore, the Faraday rotation principle employed in the optical waveguide provides for excellent linearity and temperature stability. The sensor's compact size and integration capability make it ideal for space-constrained applications, while its inherent immunity to electromagnetic interference enhances its reliability in noisy electrical environments.

It is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A power converter, comprising:
   circuitry;
   a metal trace through which a current output by the circuitry flows;
   a current sensor configured to measure the current, the current sensor comprising:
   a package having disposed therein:
       a first integrated circuit (IC);
       a light emitting layer operatively coupled to the first IC and configured to emit light having an intensity proportional to a reference current received by the first IC;
       an optical waveguide having an input receiving the light emitted by the light emitting layer and having an output, wherein the optical waveguide is configured to modulate the light passing therethrough based on a magnetic field generated by the current in the metal trace;
       a photosensing layer configured to generate a photocurrent representative of the intensity of the light output from the optical waveguide; and
       a second integrated circuit (IC) operatively coupled to the photosensing layer and configured to output a sense current based upon the photocurrent, with the sense current being representative of the current in the metal trace.

2. The power converter of claim 1, wherein the light emitting layer comprises a first layer of quantum dots; and wherein the first IC is configured to excite the first layer of quantum dots to emit the light having the intensity proportional to the reference current.

3. The power converter of claim 1, wherein the photosensing layer comprises a second layer of quantum dots; and wherein the second IC is configured to generate the sense current based on the photocurrent.

4. The power converter of claim 1, wherein the package also has disposed therein a first optical filter configured to filter the light emitted by the light emitting layer prior to entry of that light into the optical waveguide, and a second optical filter configured to filter the light output from the optical waveguide prior to impingement of that light upon the photosensing layer.

5. The power converter of claim 1, wherein the optical waveguide comprises:
   a first polarizer at the input configured to linearly polarize the light entering the optical waveguide;
   a second polarizer at the output; and
   a Faraday rotator material disposed between the first polarizer and the second polarizer, the Faraday rotator material configured to rotate a plane of polarization of the light passing therethrough by an angle proportional to intensity of the magnetic field generated by the current in the metal trace;

wherein the second polarizer is oriented at a predetermined angle relative to the first polarizer to selectively transmit light based on the rotation of its plane of polarization, thereby modulating the intensity of the light output from the optical waveguide in proportion to the current in the metal trace.

6. The power converter of claim 1, wherein the metal trace is disposed on a printed circuit board (PCB), and wherein the package of the current sensor is affixed to the PCB above the metal trace.

7. The power converter of claim 1, wherein the metal trace passes through the package of the current sensor.

8. The power converter of claim 1, further comprising control circuitry configured to receive the sense current from the current sensor, wherein the control circuitry comprises:
   a voltage divider comprising a plurality of resistors connected in series between an input receiving the sense current and ground;
   a flash analog-to-digital converter (ADC) having inputs connected to taps between the resistors of the voltage divider;
   a controller configured to receive a digital output from the flash ADC; and
   a driver stage configured to receive control signals from the controller and generate output signals for controlling the circuitry of the power converter.

9. The power converter of claim 1, further comprising control circuitry configured to receive the sense current from the current sensor, wherein the control circuitry comprises:
   a resistor connected between an input receiving the sense current and ground;
   a voltage controlled oscillator (VCO) having an input connected to a node between the input receiving the sense current and the resistor;
   a high-speed counter configured to receive a low-frequency signal output from the VCO, the high-speed counter being clocked by a clock signal having a frequency greater than a frequency of the low-frequency signal;
   a controller configured to receive a count value from the high-speed counter; and
   a driver stage configured to receive control signals from the controller and generate output signals for controlling the circuitry of the power converter.

10. The power converter of claim 1, further comprising control circuitry configured to receive the sense current from the current sensor, wherein the control circuitry comprises:
   a current controlled delay line (CCDL) having a current input receiving the sense current;
   a low-speed counter configured to count a delay between a low-frequency reference signal input to the CCDL and a delayed version of the low-frequency reference signal output from the CCDL, wherein the low-speed counter is clocked by a clock signal having a higher frequency than the low-frequency reference signal;
   a controller configured to receive a count value from the low-speed counter; and a driver stage configured to receive control signals from the controller and generate output signals for controlling the circuitry of the power converter.

11. A method of galvanically isolated current sensing, comprising:
   generating a reference current;
   emitting light having an intensity proportional to the reference current;
   passing the emitted light through an optical waveguide;
   modulating the light passing through the optical waveguide based on a magnetic field generated by a current to be sensed;
   detecting the modulated light output from the optical waveguide;
   generating a photocurrent representative of an intensity of the detected modulated light; and
   outputting a sense current based on the photocurrent, the sense current being representative of the current to be sensed.

12. The method of claim 11, wherein emitting light comprises exciting a first layer of quantum dots with a first integrated circuit (IC) to emit the light having the intensity proportional to the reference current.

13. The method of claim 11, wherein detecting the modulated light comprises using a second layer of quantum dots to generate the photocurrent.

14. The method of claim 11, further comprising: filtering the emitted light prior to passing it through the optical waveguide; and filtering the modulated light output from the optical waveguide prior to detecting it.

15. The method of claim 11, wherein modulating the light passing through the optical waveguide comprises: linearly polarizing the light entering the optical waveguide; rotating a plane of polarization of the linearly polarized light by an angle proportional to an intensity of the magnetic field generated by the current to be sensed; and selectively transmitting the light based on the rotation of its plane of polarization.

16. The method of claim 11, further comprising: converting the sense current to a digital value using a flash analog-to-digital converter (ADC); generating control signals based on the digital value; and controlling a power converter circuit based on the control signals.

17. The method of claim 11, further comprising: converting the sense current to a voltage; generating a low-frequency signal having a frequency proportional to the voltage; counting cycles of the low-frequency signal using a high-speed counter; generating control signals based on a count value from the high-speed counter; and controlling a power converter circuit based on the control signals.

18. The method of claim 11, further comprising: delaying a low-frequency reference signal based on the sense current using a current controlled delay line (CCDL); counting a delay between the low-frequency reference signal and a delayed version of the low-frequency reference signal; generating control signals based on the counted delay; and controlling a power converter circuit based on the control signals.

* * * * *